United States Patent [19]

Davies et al.

[11] Patent Number: 4,883,648
[45] Date of Patent: Nov. 28, 1989

[54] CUBIC BORON NITRIDE MANUFACTURE

[76] Inventors: Geoffrey J. Davies, 36 Boundary Road, Linden Ext., Randburg, Transvaal; Lesley K. Hedges, 4 Oriole Mews, Delphinium Street, Brackenhurst, Transvaal; Stuart H. Robertson, 92 Duke of York Avenue, Northcliff Ext. 4, Johannesburg, Transvaal, all of South Africa

[21] Appl. No.: 79,259

[22] Filed: Jul. 29, 1987

[30] Foreign Application Priority Data

Jul. 30, 1986 [ZA] South Africa .................. 86/5695

[51] Int. Cl.$^4$ .................. C01B 21/064; C30B 29/38
[52] U.S. Cl. .................. 423/290; 156/616.3; 156/616.4; 156/616.41; 156/DIG. 86; 156/DIG. 99; 422/245
[58] Field of Search .............. 423/290; 156/DIG. 86, 156/DIG. 99, 616.3, 616.4, 616.41; 422/245

[56] References Cited

U.S. PATENT DOCUMENTS

| | | | |
|---|---|---|---|
| 3,192,015 | 6/1965 | Wentorf, Jr. | 156/DIG. 86 |
| 4,551,195 | 11/1985 | Iizuka et al. | 423/290 |
| 4,699,687 | 10/1987 | Yazu et al. | 423/290 |

FOREIGN PATENT DOCUMENTS 131811 7/1985 Japan .

Primary Examiner—John Doll
Assistant Examiner—Jeffrey Edwin Russel
Attorney, Agent, or Firm—Michael N. Meller

[57] ABSTRACT

A method is provided for producing large cubic boron nitride crystals having the size of 0.1 carat or larger. The method involves providing a reaction vessel which contains CBN seed material (32), a CBN source (26) separated from the seed material and sandwiched between two masses (22) (24) of solvent/catalyst for CBN synthesis which is capable of melting under CBN synthetic conditions, and contains sufficient hexagonal boron nitride to saturate the catalyst with boron nitride when molten, the separation of seed material and source material being such that under the operating conditions of CBN synthesis a temperature gradient is created between the seed material and the source material with the seed material being located at a point near the minimum value of temperature of the temperature gradient and the source material being located at a point near the maximum value of temperature of the temperature gradient, placing that reaction vessel in the reaction zone of a high temperature/high pressure apparatus and subjecting the contents of the reaction vessel to conditions of temperature and pressure in the CBN stable region of the boron nitride phase diagram for a period of at least several hours and not more than 24 hours.

3 Claims, 1 Drawing Sheet

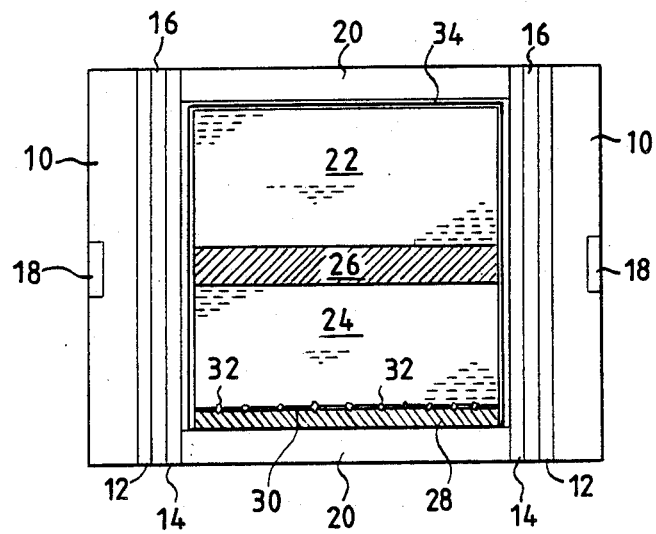

CUBIC BORON NITRIDE MANUFACTURE

BACKGROUND OF THE INVENTION

This invention relates to the manufacture of cubic boron nitride particles.

Cubic boron nitride (CBN) particles are produced commercially by subjecting hexagonal boron nitride to conditions of elevated temperature and pressure in the presence of a suitable solvent/catalyst. The elevated pressure used is typically 45–55kBars and the elevated temperature used is typically 1400° to 1600° C. The particles which are produced commercially are relatively small in size, i.e. less than 300 microns. These particles are used in a variety of grinding tools such as grinding wheels. There are several United States patent specifications which describe methods of making large diamond crystals. Examples of these patent specifications are 3,297,407, 4,034,066, 4,301,134, 4,073,380 and 4,322,396. The disclosure of each of these patent specifications is restricted to the manufacture of large crystals of diamond. There is no disclosure in any of these specifications that the methods described therein might have application to producing large crystal cubic boron nitride.

SUMMARY OF THE INVENTION

According to the present invention, there is provided a reaction vessel for introduction into the reaction zone of a high pressure/high temperature apparatus, the reaction vessel containing CBN seed material, a CBN source separated from the seed material by a mass of solvent/catalyst for CBN synthesis which is capable of melting under CBN synthesis conditions, the separation of seed material and source material being such that under the operating conditions of CBN snythesis a temperature gradient is created between the seed material and the source material with the seed material being located at a point near the minimum value of temperature of the temperature gradient and the source material being located at a point near the maximum value of temperature for the temperature gradient.

Further according to the invention, there is provided a method of producing CBN crystals including the steps of placing a reaction vessel as described above in the reaction zone of a high temperature/high pressure apparatus and subjecting the contents of the reaction vessel to conditions of temperature and pressure in the CBN stable region of the boron nitride phase diagram for a time sufficient to produce large CBN crystals.

DESCRIPTION OF THE DRAWING

The drawing illustrates a sectional side view of an embodiment of a reaction vessel of the invention.

DETAILED DESCRIPTION OF THE INVENTION

An embodiment of the invention will be now described with reference to the accompanying drawing. Referring to this drawing, there is shown a reaction vessel comprising an outer sleeve 10 made of magnesite enclosing a heater sleeve 12 and a wonderstone sleeve 14. Separating the wonderstone sleeve 14 and the heater sleeve 12 is a tantalum wrap 16. A mild steel ring 18 is provided in the magnesite sleeve 10 intermediate its ends. Endcaps 20 of wonderstone are provided to enclose within the sleeve assembly a reaction volume.

Placed within the reaction volume are the materials necessary for CBN synthesis. These materials include two masses 22, 24 of CBN solvent/catalyst. Sandwiched between the two masses 22, 24 is a CBN source 26.

The solvent/catalyst must be such that it becomes molten under the conditions of elevated temperature and pressure used for CBN synthesis. Examples of suitable solvent catalysts are alkali and alkaline earth metal boron nitrides. Examples of such boron nitrides are lithium boron nitride, magnesium boron nitride, calcium boron nitride, and mixtures thereof. The masses 22, 24 of this solvent/catalyst will also preferably contain some hexagonal boron nitride to saturate the catalyst with dissolved boron nitride when it becomes molten. This saturation serves to prevent the seeds going into solution in mass 24. The solvent/catalyst may also contain some aluminum.

The CBN source 26 will typically be a mass of fine CBN particles mixed with the solvent/catalyst and optionally a small quantity of hexagonal boron nitride. The CBN particles will typically have a size of less than 50 microns.

Located on the undersize of mass 24 is a bed of CBN seed crystals. This bed consists of a pad 28 of a suitable material such as wonderstone covered by a foil 30. Small holes are drilled through the foil 30 into the wonderstone pad 28. Good quality CBN seed crystals 32 are then set into these holes. The size, number and geometric arrangement of the seeds may be varied depending on the size and quantity of CBN crystals to be grown. The CBN source, solvent/catalyst masses 22, 24 and CBN seed material are all contained in a cannister 34 made of a refractory material such as tantalum, molybdenum, titanium, zirconium or nioboim.

In use, the reaction vessel is placed in the reaction zone of a conventional high pressure/high temperature apparatus. The pressure of the reaction zone is increased and the temperature thereafter increased to bring the conditions within the reaction volume into the CBN stable region of the boron nitride phase diagram. Under these conditions, a temperature gradient is created within the mass 24 such that the highest temperature is in the region of the CBN source whilst the lowest temperature of this gradient is in the region of the CBN seed crystals. The elevated temperature and pressure conditions are maintained for a period of several hours and typically up to 24 hours. During this time, CBN source material dissolves in the mass 24 and migrates downwards. Before the seed crystals can dissolve in the solvent/catalyst, the boron nitride atoms from the CBN source migrating downwards reach the seed crystals and cause growth on the seed crystals to occur. CBN nucleation and growth modifiers may be incorporated in the CBN source and/or solvent/catalyst masses. Examples of such products are phosphorus compounds, metal borides and elements which produce semiconducting cubic boron nitride such as beryllium, silicon, germanium, selenium and sulphur.

Using the reaction vessel described above and the following conditions large CBN crystals, e.g., at least 0.1 carats, were produced. Several stones slightly larger than 10 stones per carat were obtained.

| CONDITIONS | |
|---|---|
| Pressure | 45 to 55 kilobars |
| Temperature | 1400° C. to 1600° C. |

-continued

| CONDITIONS | |
|---|---|
| Solvent/catalyst | 50 mole percent mixture of calcium boron nitride and magnesium boron nitride + 5% by weight hexagonal boron nitride |
| Source | 12 g - 44 micron CBN<br>8.5 g - magnesium boron nitride<br>12.8 g - calcium boron nitride<br>1.0 g - hexagonal boron nitride |
| Seed bed | 90 CBN seeds 250-297 micron - 3 mm spacing |
| High pressure/temperature cycle time | 12 hours |

A growth rate of about 3mg/hr was obtained.

We claim:

1. A method of producing CBN crystals including the steps of placing a reaction vessel into the reaction zone of a high pressure/high temperature apparatus, the reaction vessel containing CBN seed material, a CBN source separated from the seed material and sandwiched between two masses of solvent/catalyst for CBN synthesis which is capable of melting under CBN synthesis conditions, and contains sufficient hexagonal boron nitride to saturate the catalyst with boron nitride when molten, the separation of seed material and source material being such that under the operating conditions of CBN synthesis a temperature gradient is created between the seed material and the source material with the seed material being located at a point near the minimum value of temperature of the temperature gradient and the source material being located at a point near the maximum value of temperature for the temperature gradient in the reaction zone of a high temperature/high pressure apparatus and subjecting the contents of the reaction vessel to conditions of temperature and pressure in the CBN stable region of the boron nitride phase diagram for not more than 24 hours to produce CBN crystals.

2. A method according to claim 1 wherein the CBN crystals which are produced have a size of at least 0.1 carat.

3. A method according to claim 1 wherein the pressure which is applied is in the range 45 to 55 kilobars and the temperature which is applied is in the range 1400° C. to 1600° C. and these conditions are maintained for a period of at least 12 hours.

* * * * *